United States Patent [19]

Muramoto et al.

[11] 4,267,557
[45] May 12, 1981

[54] SEMICONDUCTOR DEVICE

[75] Inventors: Ken-ichi Muramoto, Kawasaki; Keizo Tani, Tokyo; Yutaka Tomisawa, Yokohama; Makoto Hideshima, Tokyo, all of Japan

[73] Assignee: Tokyo Shibaura Denki Kabushiki Kaisha, Japan

[21] Appl. No.: 44,402

[22] Filed: Jun. 1, 1979

[30] Foreign Application Priority Data

Jun. 8, 1978 [JP] Japan .................. 53-68317
Jun. 8, 1978 [JP] Japan .................. 53-68318
Jun. 8, 1978 [JP] Japan .................. 53-68319

[51] Int. Cl.$^3$ ............................ H01L 29/06
[52] U.S. Cl. ...................... 357/20; 357/13; 357/34; 357/86
[58] Field of Search .................. 357/13, 86, 20, 34

[56] References Cited

U.S. PATENT DOCUMENTS 4,109,274  8/1978  Belenkov et al. ............... 357/86

Primary Examiner—Edward J. Wojciechowicz
Attorney, Agent, or Firm—Finnegan, Henderson, Farabow, Garrett & Dunner

[57] ABSTRACT

A junction type semiconductor device, wherein a protective diode is formed in a part of the region consisting of a base region and a collector region. The device permits reducing the manufacturing cost of semiconductor elements, makes it possible to provide a smaller electric apparatus, and is high in reliability.

8 Claims, 34 Drawing Figures

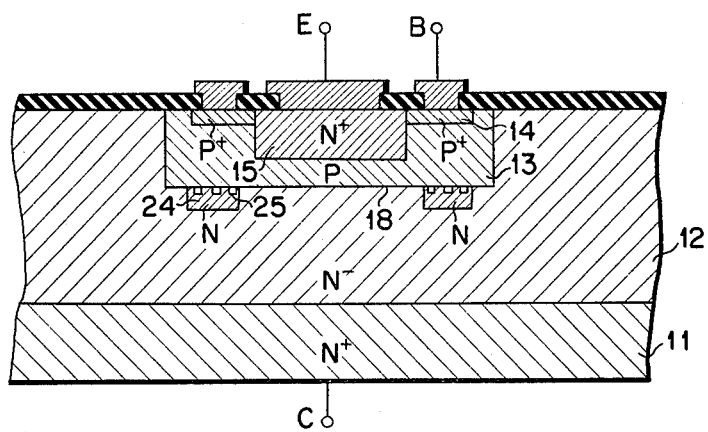
F I G. 8
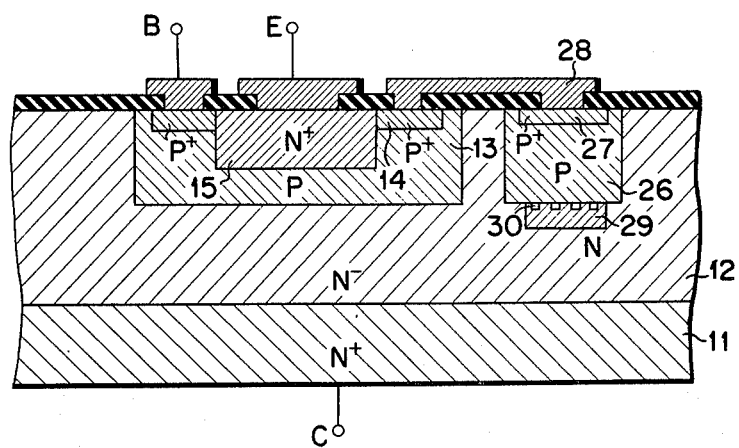
F I G. 9
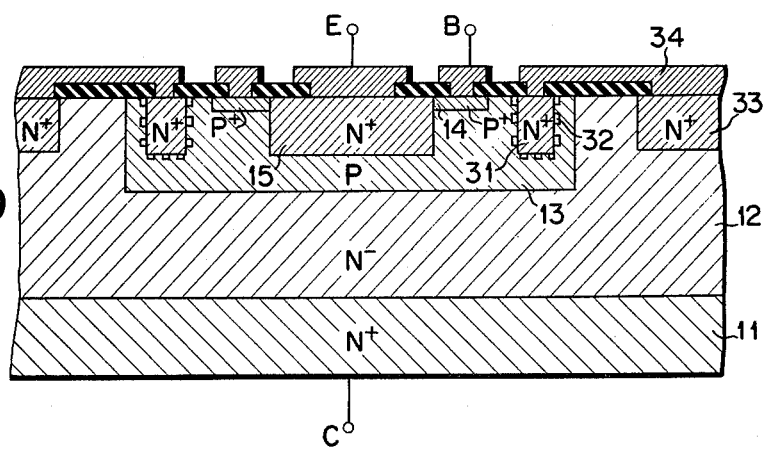
F I G. 10

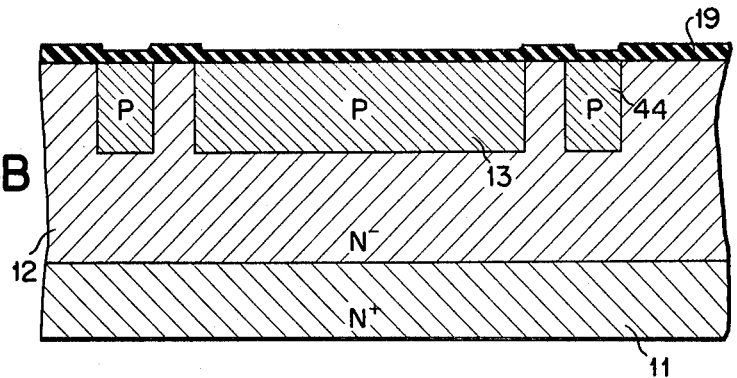
F I G. 14B
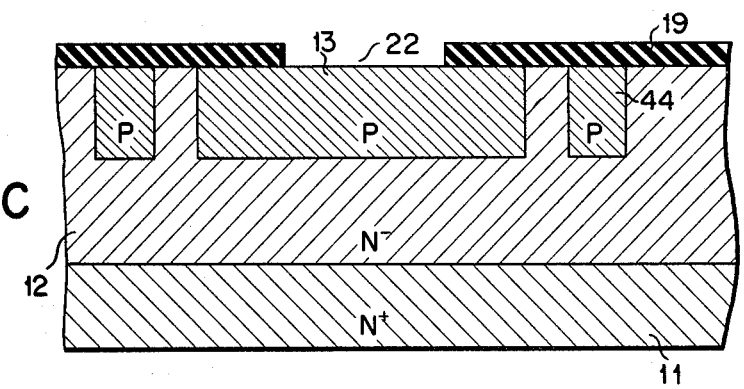
F I G. 14C
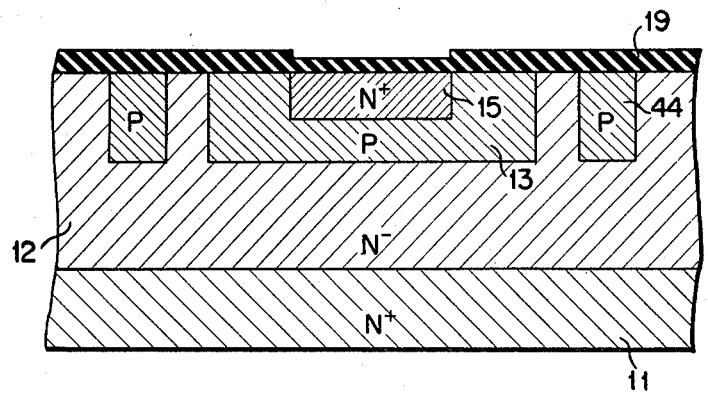
F I G. 14D

SEMICONDUCTOR DEVICE

BACKGROUND OF THE INVENTION

This invention relates to a semiconductor device, particularly, to a semiconductor device free from destruction even in the event of overloading.

Appended FIG. 1 shows an example of the construction of a conventional junction type transistor for power amplification, hereinafter referred to as the "power transistor", with FIG. 2 showing an example of the output characteristics of the conventional power transistor. In FIG. 1, reference numerals 1 and 2 denote a low resistive N+ region and a high resistive N− region, respectively. As shown in the drawings, a P type base region 3 is formed within the N− region 2 by selective diffusion. Further, a P+ region 4 is formed in the base region 3 for providing an ohmic contact between the base electrode and the base region. Still further, an N+ emitter region 5 is formed within the base region 3 by selective diffusion. Incidentally, the letters C, B and E shown in FIG. 1 represent a collector electrode, a base electrode and an emitter electrode, respectively.

In the graph of FIG. 2, the collector voltage $V_c$ and the collector current $I_c$ are plotted on the absissa and the ordinate, respectively, with the curves of solid lines representing the output characteristics of the conventional transistor and the broken lines indicating the secondary breakdown phenomenon. It is widely known that occurrence of the secondary breakdown phenomenon leads to the complete destruction of the transistor in many cases. Thus, in the actual operation of the power transistor, the collector voltage $V_c$ and the collector current $I_c$ are controlled not to exceed the one-dot chain line shown in FIG. 2. In general, the region beyond the one-dot chain line is called "a secondary breakdown limiting region" (S/B limiting region).

FIG. 3 shows an area of safe operation of a power transistor on the logarithmic scale. In FIG. 3, line (a) denotes the current limiting line, i.e., the allowable maximum value of current which can be conducted through the collector of the transistor. Line (b) denotes the thermal resistance limiting line. Incidentally, line (b) varies with the manner of heat releasing, ambient temperature, etc. and is also called "a power limiting line". Where the manner of heat releasing, ambient temperature, etc. are constant, the product of the voltage and current, i.e., power, is constant in any point of line (b). It follows that line (b) makes an angle of 45° with each of the voltage axis and the current axis in the log-log chart of FIG. 3. Line (d) denotes the voltage limiting line. Further, line (c) denotes the S/B limiting line. Incidentally, line (c) extends in a manner to diminish the safe operation area of the transistor defined by the lines (a) (b) and (d) as well as the axes of the graph. Occurrence of the secondary breakdown phenomenon is serious in a majority of conventional power transistors, particularly, in high voltage power transistors, rendering it necessary to take some countermeasures. Specifically, it was customary in the past to use a protective circuit in operating a power transistor so that the voltage and/or the current of the transistor may not fall within the S/B limiting region.

FIG. 4 shows an example of the conventional circuit including a protective circuit. It is seen that a protective diode 7 is connected between the collector and base of a power transistor 6. In the drawing, reference numerals 8 and 10 represent a load and a fuse, respectively. Further, reference numerals 9a and 9b represent an input terminal and an output terminal to which is applied the output voltage $V_{cc}$, respectively. In the circuit of FIG. 4 the breakdown voltage of the protective diode 7 is set lower than the maximum rated voltage of the power transistor 6 and higher than the operating voltage of the power transistor.

Suppose a short circuit has occurred in the load 8. In this case, the output voltage $V_{cc}$ is applied directly to the collector of the power transistor 6 and to the cathode of the protective diode 7. What should be noted is that breakdown occurs in the diode 7 first. Naturally, the breakdown current is added to the base current of the power transistor, resulting in that the collector current is amplified prominently because the collector current $I_c$ is $h_{FE}$ times as much as the base current $I_B$ in a power transistor ($h_{FE}=I_C/I_B$). Needless to say, $h_{FE}$ represents the current amplification factor of the power transistor. The prominently amplified collector current causes a fuse connected to the emitter or collector (the fuse 10 connected to the emitter in the circuit of FIG. 4) to be broken, thereby preventing the power transistor 6 from being driven into the S/B limiting region. It follows that the power transistor 6 is rendered free from destruction.

FIG. 5, showing operating characteristics of a power transistor, is intended to explain the phenomenon described above. Normally, the transistor 6 operates at point (e) on the load line. But, in the event of short circuit occurrence in the load 8, the operation point of the transistor is moved to point (f) on the A—A line representing the break down voltage of the protective diode 7. If the protective diode 7 is not included in the circuit, the operation point of the transistor is moved to point (g), resulting in complete destruction of the transistor. However, the presence of the protective diode 7 permits the transistor to operate outside the S/B limiting region, leading to protection of the transistor.

If a protective circuit is not included, destruction is caused not only in the power transistor itself but also in other transistors included in the electric apparatus. In the worst case, the electric apparatus itself is completely destroyed.

As described above, it is very important to use a protective circuit in operating a power transistor. In general, zener diodes or the like are used as the element of the protective circuit. However, use of the protective circuit of this type gives rise to the following drawbacks:

1. Increase in the number of elements constituting the transistor circuit, leading to a high manufacturing cost of the transistor circuit.

2. It may happen that a protective diode having an unsuitable breakdown voltage is connected to a power transistor.

3. Much labor and a large space are required for the wiring, rendering it difficult to produce a small electric apparatus.

4. Low reliability of the transistor circuit and the electric apparatus.

5. The produced device is weak against moisture and pollution.

SUMMARY OF THE INVENTION

An object of this invention is to provide a junction type semiconductor device free from the above-noted difficulties accompanying the conventional device.

According to this invention, there is provided a junction type semiconductor device, comprising a protective diode formed in a part of the region including the base and collector regions of a power transistor.

BRIEF DESCRIPTION OF THE DRAWINGS

FIG. 10 is the cross sectional view of a power transistor according to another embodiment of this invention, FIGS. 14A to 14F are cross sectional views collectively showing the steps of producing the power transistor of FIG. 13.

DESCRIPTION OF THE PREFERRED EMBODIMENT

This invention provides the following three types of junction type semiconductor devices, particularly, power transistors, having a protective diode incorporated therein:

Type A:

A junction type semiconductor device, comprising a high impurity concentration region formed within a collector region. The high concentration region is equal to the collector region in conductivity type and positioned such that a PN junction is formed between the high concentration region and a base region. In other words, a diode is provided by the high concentration region and the base region. Alternatively, a region equal to the base region in conductivity type is formed within the collector region. Said region is positioned apart from and electrically connected to the base region. In this case, a diode is provided by said region and the high impurity concentration region formed within the collector region.

Type B:

A junction type semiconductor device, comprising a high impurity concentration region formed within a base region. The high concentration region is opposite to the base region in conductivity type and electrically connected to a collector region. Naturally, a PN junction is formed between the high concentration region and the base region and, thus, a diode is provided.

Type C:

A junction type semiconductor device, comprising a region formed within a collector region. Said region is opposite to the collector region in conductivity type and positioned within the area covered by the depletion layer extending from the PN junction between the base and collector regions. Further, an electric short circuit is formed between the region formed within the collector region and the collector region.

Figure 1:
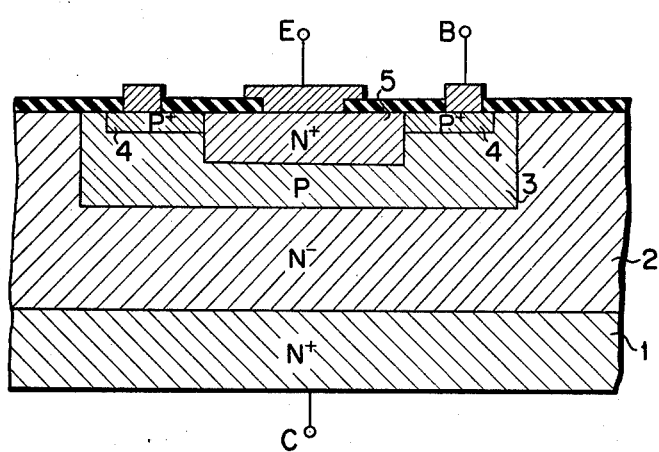
FIG. 1 is the cross sectional view of a conventional power transistor.
Figure 2:
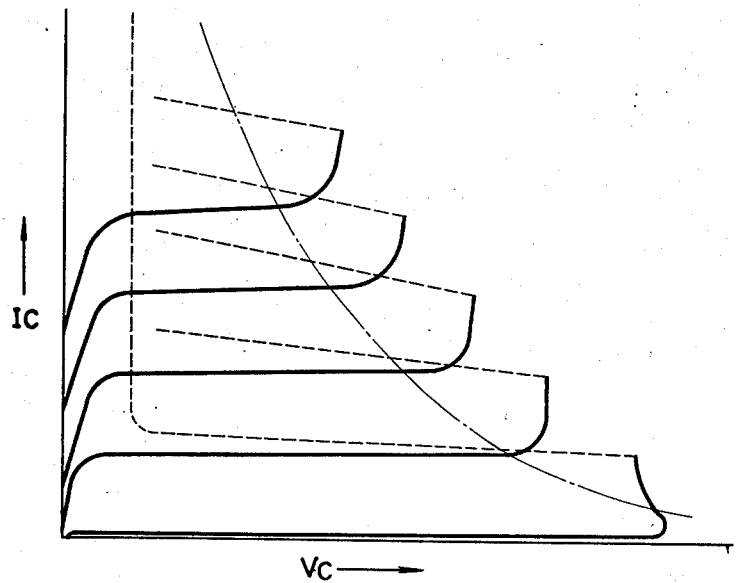
FIG. 2 is a graph showing an example of the output characteristics of a power transistor.
Figure 3:
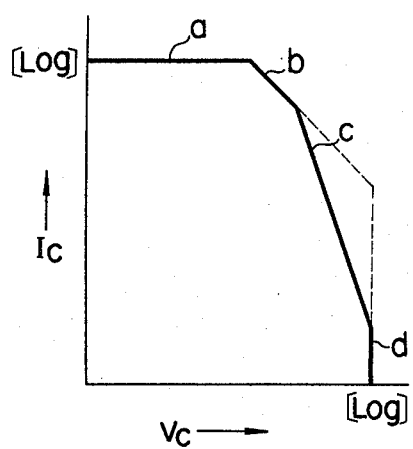
FIG. 3 is a log-log diagram showing the area of safe operation of a power transistor.
Figure 4:
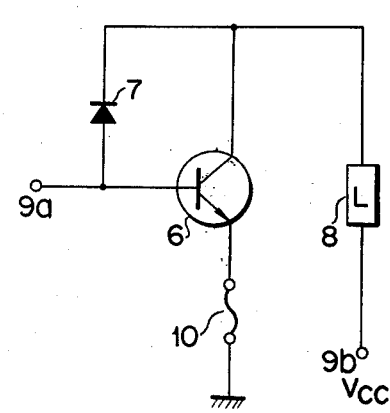
FIG. 4 is the diagram of a circuit including a power transistor and a protective diode.
Figure 5:
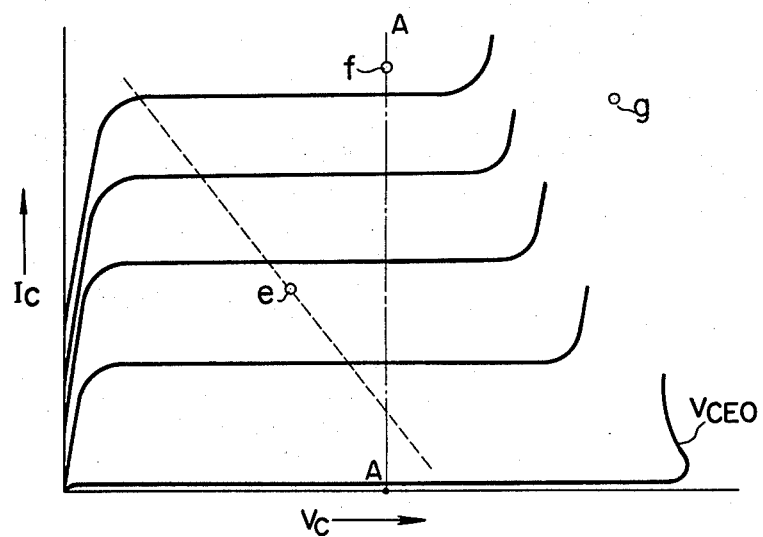
FIG. 5 is a graph showing an example of operating characteristics of a power transistor.
Figure 6:
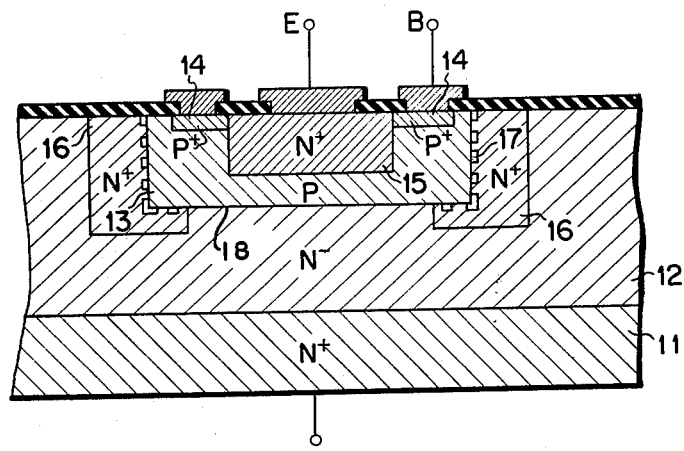
FIG. 6 is the cross sectional view of a power transistor according to one embodiment of this invention.

FIG. 6 shows the cross section of a power transistor according to one embodiment of the type A semiconductor device. As shown in the drawing, the collector region of the transistor consists of a low resistive N+ region 11 and a high resistive N− region 12. It is seen that a P type base region 13 is formed within the N− region 12 by selective diffusion. Further, a P+ region 14 is formed within the base region 13 for providing an ohmic contact between the base electrode and the base region 13. Still further, an N+ emitter region 15 is formed within the base region 13 by selective diffusion. Incidentally, letters C, B and E shown in FIG. 6 represent a collector electrode, a base electrode and an emitter electrode, respectively. It is important to note that an N region 16 is formed within the N− region 12 (collector region) by selective diffusion such that a PN junction 17 is formed between the N region 16 and the P type base region 13. Specifically, the N region 16 and the base region 13 jointly form a diode including the PN junction 17, said diode corresponding to the protective diode 7 shown in FIG. 4. Naturally, the PN junction 17 serves to determine the breakdown voltage between the base and collector of the transistor.

In general, the breakdown voltage of a PN junction is proportional to both the width of the depletion layer around the PN junction and the critical electric field allowable in the depletion layer. It is widely known to the art that the width of the depletion layer mainly serves to determine the breakdown voltage. Extension of the depletion layer is inversely proportional to the impurity concentration. In other words, a lower impurity concentration leads to a larger depletion layer, resulting in a higher breakdown voltage. It follows that, in the power transistor of FIG. 6, the depletion layer formed around a collector-base junction 18 is larger than that formed around the PN junction 17 between the P type base region 13 and the N region 16. Since the breakdown voltage is proportional to the width of the depletion layer as mentioned above, the breakdown between the collector and base of the transistor occurs at the PN junction 17. It is important to note that the breakdown voltage of the PN junction 17 can be controlled as desired by controlling the impurity concentrations of the P type base region 13 and the N region 16. It follows that the transistor of FIG. 6 comprises an interior protective diode equivalent to the protective diode 7 shown in FIG. 4.

Figure 7A:
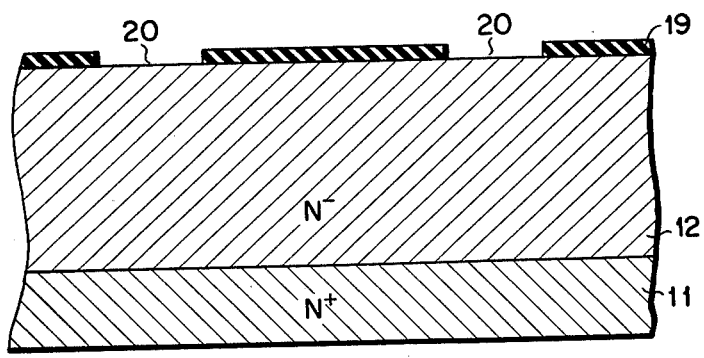
FIGS. 7A to 7H are cross sectional views collectively showing the steps of producing the power transistor of FIG. 6, FIGS. 8 and 9 are cross sectional views each showing a modification of the power transistor of FIG. 6.
Figure 7B:
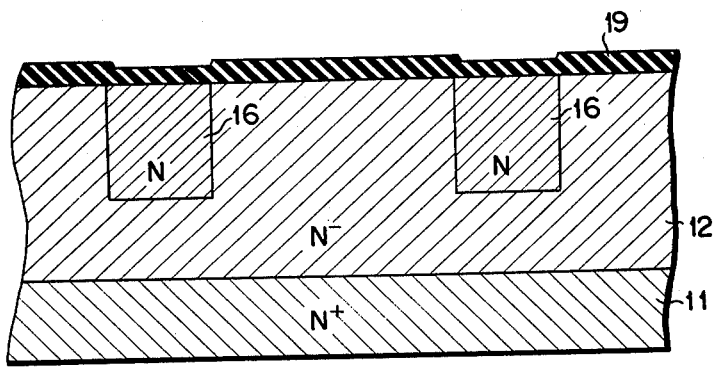
Figure 7C:
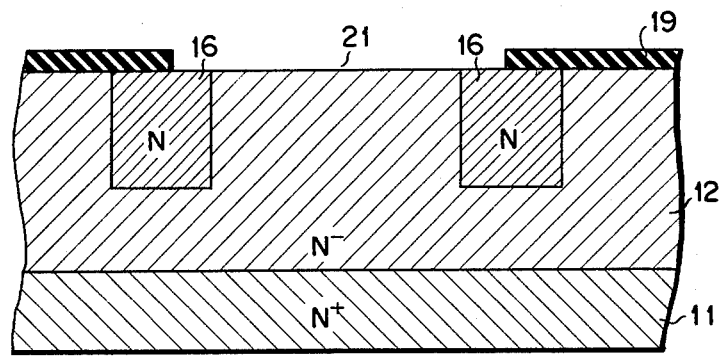
Figure 7D:
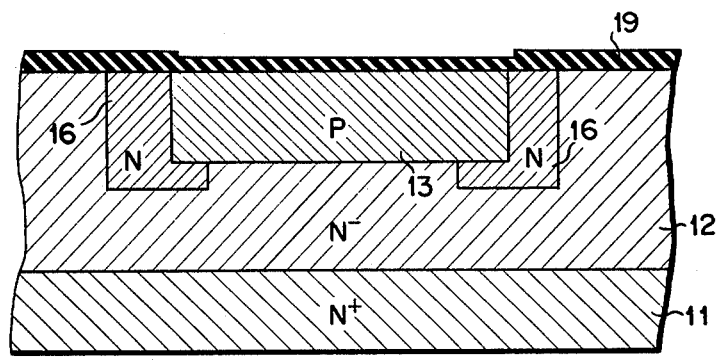
Figure 7E:
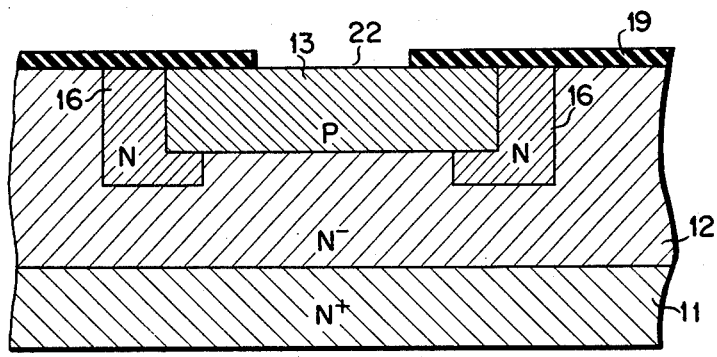
Figure 7F:
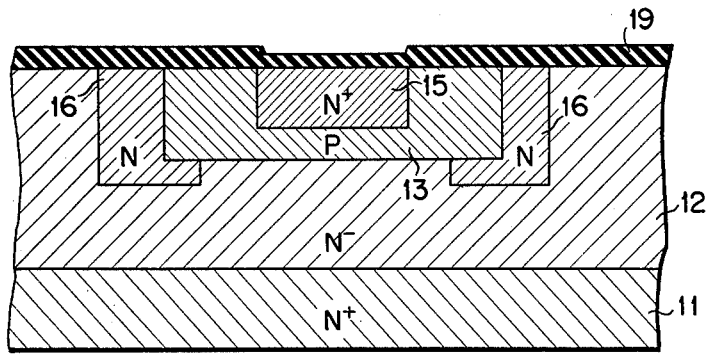
Figure 7G:
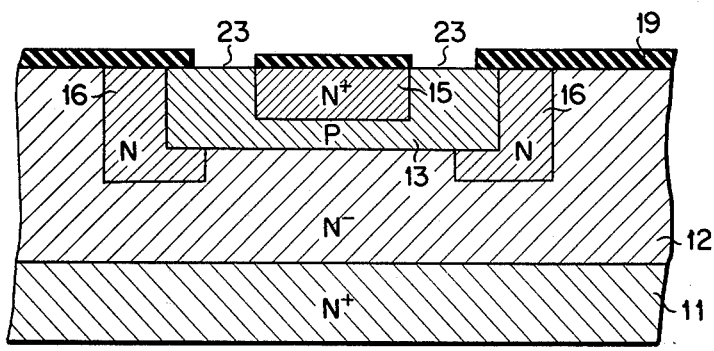
Figure 7H:
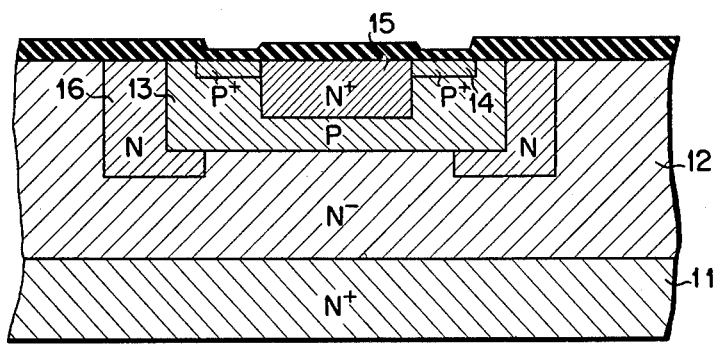

FIGS. 7A to 7H collectively show how to produce the transistor shown in FIG. 6. In the first step, a silicon dioxide layer 19 formed on the surface of a semiconductor substrate consisting of a low resistive N+ region 11 and a high resistive N− region 12 is selectively removed so as to provide an opening 20 as shown in FIG. 7A. Then, an N type impurity is diffused through the opening 20 into the N− region 12 so as to form an N region 16. In this step, a silicon dioxide layer is formed on the surface of the substrate, as shown in FIG. 7B. After selective removal of the silicon dioxide layer to provide an opening 21 (FIG. 7C), a P type impurity is diffused through the opening 21 so as to form a P region 13 (base region) as shown in FIG. 7D. FIG. 7C shows that the opening 21 is provided in a manner to expose partly the N region 16 as well. After formation of the P region 13, a silicon dioxide layer formed on the surface of the substrate in the step of forming the P region B is selectively removed so as to provide an opening 22 as shown in FIG. 7E. Then, an N type impurity is diffused through the opening 22 into the P type base region 13 so as to form an N+ emitter region 15. A silicon dioxide layer is formed in this step, too, on the surface of the substrate (FIG. 7F). Further, the silicon dioxide layer is selectively removed to provide an opening 23 (FIG. 7G), followed by diffusing a P type impurity through the opening 23 into the P type base region 13 so as to form a P+ region 14 (FIG. 7H). Finally, an emitter electrode E, a base electrode B and a collector electrode C are mounted as shown in FIG. 6, thereby providing a junction type transistor having a protective diode incorporated therein. Incidentally, the P+ region 14 is intended to provide an ohmic contact between the base electrode and the base region.

In the manufacturing process described above, the P+ region 14 is formed after formation of the emitter region 15. But, the $P^{30}$ region 14 may be formed before formation of the emitter region 15.

FIGS. 8 and 9 show additional embodiments of the type A transistor. The transistor shown in FIG. 8 is intended to set the breakdown voltage of the protective diode portion at a high value. To this end, an N region 24 providing the cathode region of the protective diode incorporated in the transistor is formed far apart from the substrate surface. It should be noted that a PN junction 25 formed between the N region 24 and the P type base region 13 is positioned at the deepest portion of the base region 13 which is lower in impurity concentration than the upper portion of the base region 13. Naturally, the breakdown voltage of the PN junction 25 is rendered higher if positioned as shown in FIG. 8.

In the embodiment of FIG. 9, a P region 26 providing the anode region of the protective diode incorporated in the transistor is formed apart from the P type base region 13. Further, an N region 29 is formed in a manner to provide a PN junction 30 between the P region 26 and the N region 29. In other words, the protective diode is provided by the P region 26 and the N region 29. In this case, the P region 26 and the P type base region 13 are interconnected by an electrode 28 made of aluminum or the like. Incidentally, a P+ region 27 formed at the surface region of the P region 26 is intended to provide an ohmic contact between the electrode 28 and the P region 26.

FIG. 10 shows a power transistor according to one embodiment of the type B semiconductor device. In this embodiment, an N+ region 31 is formed within the P type base region 13. Naturally, a PN junction 32 is formed between the N+ region 31 and the base region 13. In other words, the protective diode is formed by these regions 31 and 13. It is seen that another N+ region 33 is formed at the surface region of the collector region 12. Further, these N+ regions 31 and 33 are interconnected by an electrode layer 34. Incidentally, the N+ region 33 is intended to provide an ohmic contact between the electrode layer 34 and the collector region 12. The transistor of FIG. 10 is equal to the type A transistor in operation principle.

Figure 11A:
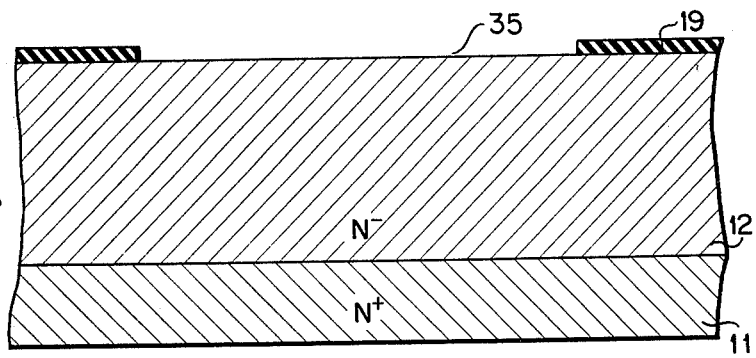
FIGS. 11A to 11F are cross sectional views collectively showing the steps of producing the power transistor of FIG. 10.
Figure 11B:
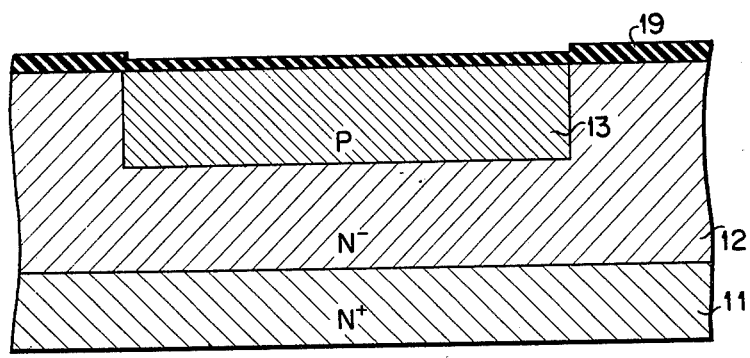
Figure 11C:
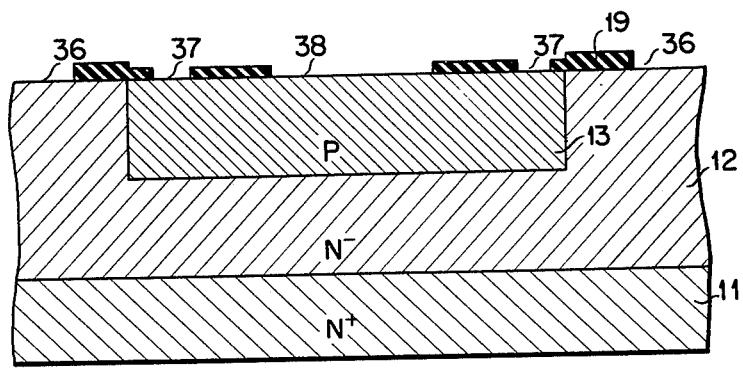
Figure 11D:
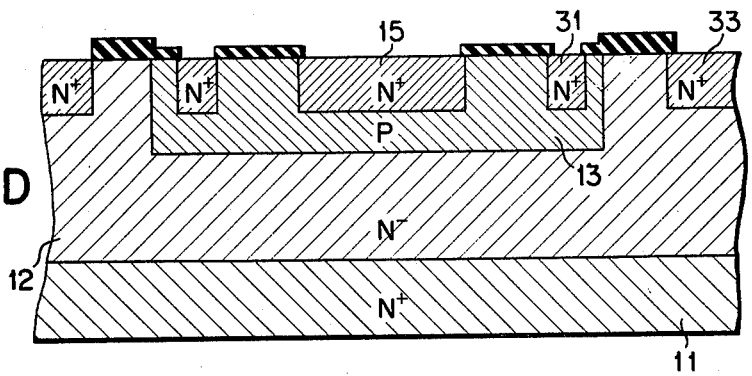
Figure 11E:
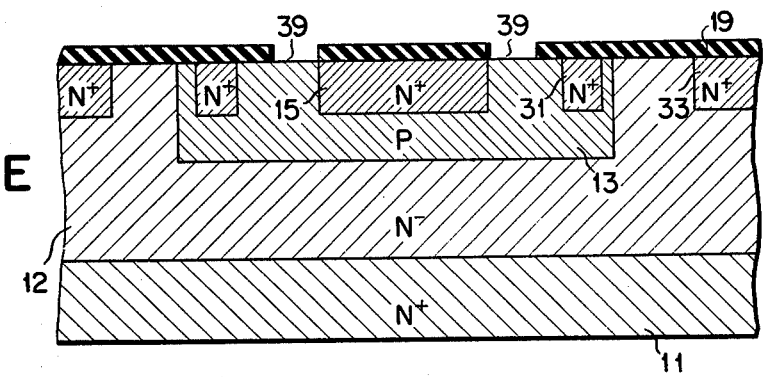

FIGS. 11A to 11F collectively show how to produce the transistor shown in FIG. 10. In the first step, a silicon dioxide layer 19 formed on the surface of a semiconductor substrate consisting of an N+ region 11 and an N− region 12 is selectively removed so as to provide an opening 35 (FIG. 11A). Then, a P type impurity is diffused through the opening 35 into the N− region 12 so as to form a P type base region 13. In this step, a silicon dioxide layer is formed on the surface of the substrate (FIG. 11B). Further, the silicon dioxide layer is selectively removed so as to provide openings 36, 37 and 38 (FIG. 11C), followed by diffusing an N type impurity through these openings into the substrate so as to form N+ regions 33, 31 and 15 (FIG. 11D). Naturally, the N+ region 15 is the emitter region and the N+ regions 31 and 33 provide the cathode region of the protective diode incorporated in the transistor. After formation of these N+ regions, a silicon dioxide layer formed on the surface of the substrate in the step of forming these N+ regions is selectively removed so as to provide an opening 39 (FIG. 11E). Then, a P type impurity is diffused through the opening 39 into the base region 13 so as to form a P+ region 14 (FIG. 11F) providing an ohmic contact between the base electrode formed later and the base region 13. It should be noted that the opening 39 is provided such that the P+ region 14 is formed apart from the N+ region 31. Finally, an emitter electrode E, a base electrode B, a cathode electrode layer 34 of the protective diode and a collector electrode C are mounted as shown in FIG. 10, thereby providing a junction type transistor having a protective diode incorporated therein.

In the manufacturing process described above, the P+ region 14 is formed after formation of the N+ regions 15, 31 and 33. But, the order of these steps may be reversed. Further, the N+ regions 15, 31 and 33 are formed simultaneously in the manufacturing process described above. But, it is possible to form these N+ regions by separate steps.

Figure 12:
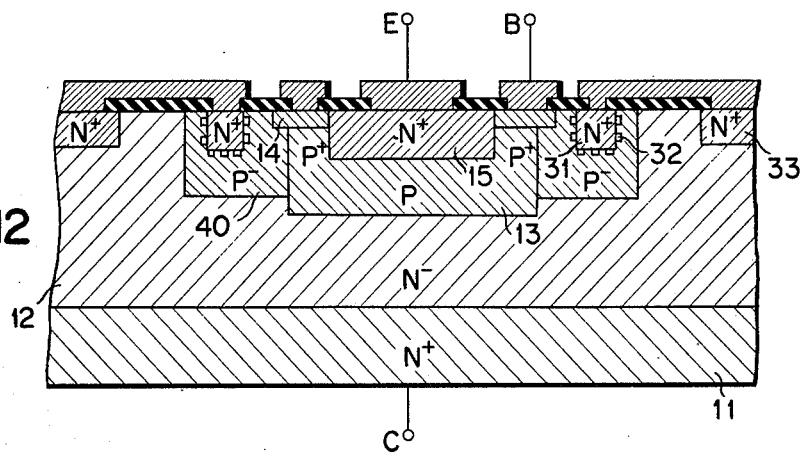
FIG. 12 is a cross sectional view showing a modification of the power transistor of FIG. 10.

FIG. 12 shows another embodiment of the type B transistor. This embodiment is suitable for setting the breakdown voltage of the protective diode at a high value. Specifically, in the embodiment of FIG. 12, the base region of the power transistor consists of a P region 13 and a P− region 40. Further, an N+ region 31 is formed within the P− region 40 by selective diffusion of an N type impurity, resulting in that a PN junction 32 is formed between the P− region 40 and the N+ region 31. Naturally, these P− region 40 and N+ region 31 jointly form a protective diode incorporated in the transistor.

Figure 13:
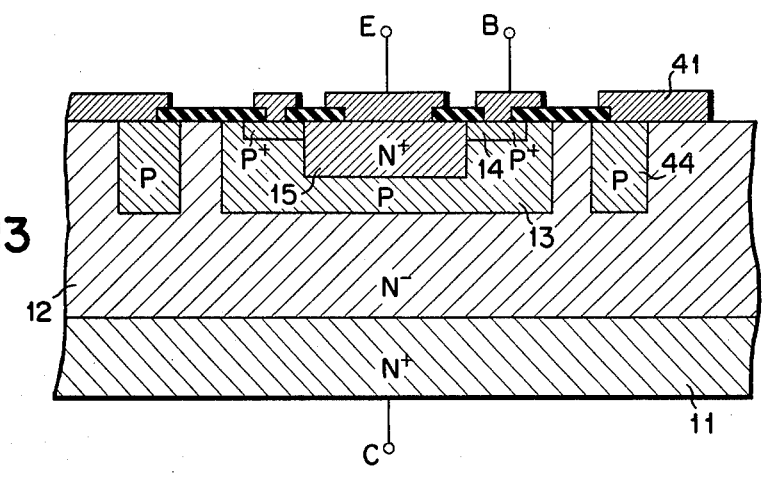
FIG. 13 is the cross sectional view of a power transistor according to still another embodiment of this invention.

· FIG. 13 shows a power transistor according to one embodiment of the type C semiconductor device. In this embodiment a P region 44 formed within an N− region 12 corresponds to the cathode region of the protective diode incorporated in the transistor. It is seen that the P region 44 and the N− region 12 are interconnected by a conductive metal layer 41.

Suppose the P region 44 is located in the area at which the depletion layer is formed extending from the PN junction between the base and collector of the transistor. In this case, breakdown occurs between the base and collector of the transistor as soon as the depletion layer mentioned above extends to reach the P region 44. It follows that the breakdown voltage between the base and collector of the transistor is determined by the distance between the base region 13 and the P region 44.

In general, breakdown of a punch-through type junction takes place as soon as the depletion layer extending from a reverse-biased PN junction reaches a forward-biased PN junction. It is widely known that the breakdown voltage in this case is proportional to the distance between the two PN junctions and to the extension capability of the depletion layer. As mentioned previously the extension capability is inversely proportional to the impurity concentration of the region between the two PN junctions. Returning to the embodiment of FIG. 13, the base-collector breakdown voltage can be controlled as desired by properly changing the distance between the P type base region 13 and the P region 44 providing the cathode region of the protective diode as described previously. It follows that the device shown in FIG. 13 is equivalent to that of FIG. 4 in which the protective diode 7 produced separately is connected between the base and collector of the power transistor 6.

Figure 11F:
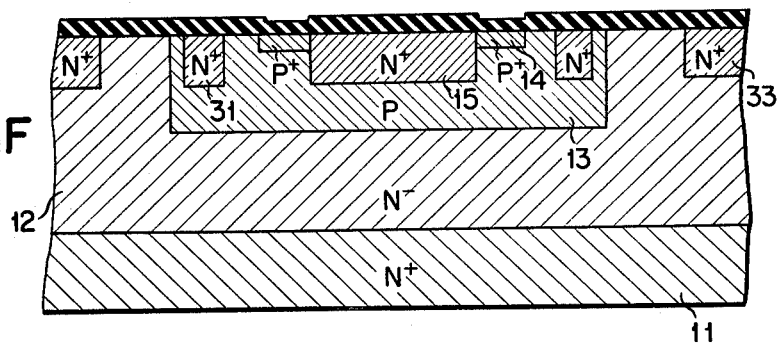
Figure 14A:
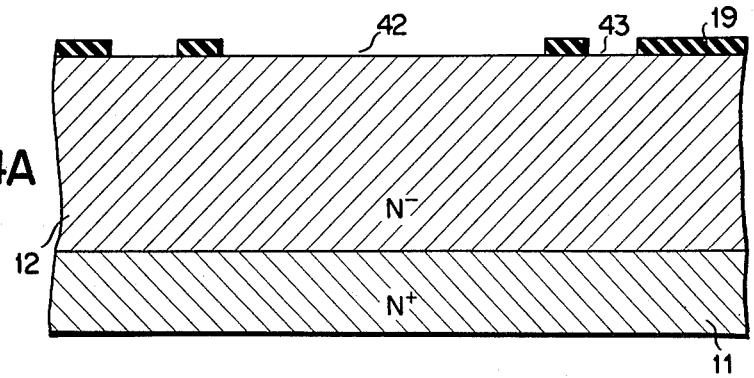
Figure 14E:
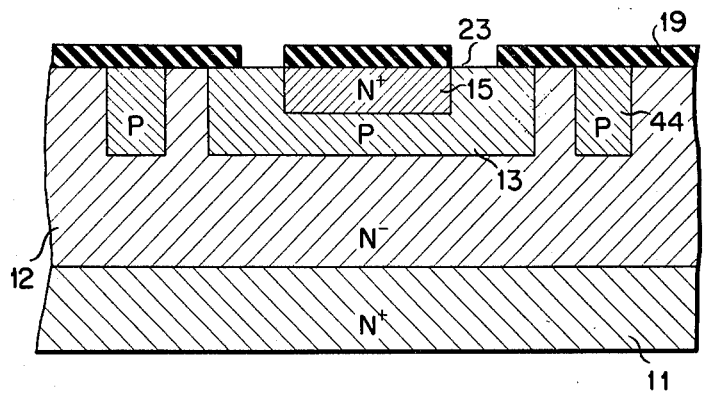
Figure 14F:
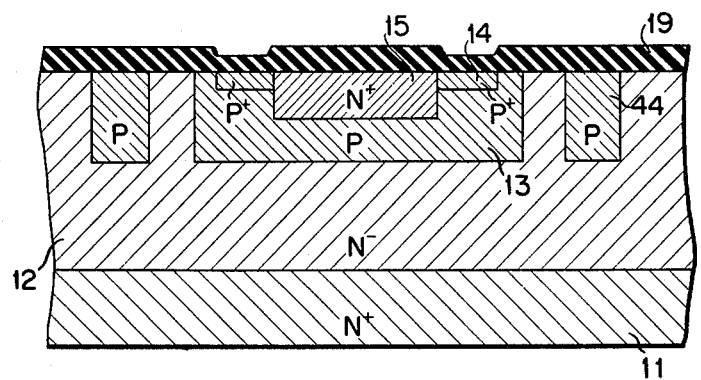

FIGS. 14A to 14F collectively show how to produce the transistor of FIG. 13. In the first step, a silicon dioxide layer 19 formed on the surface of a semiconductor substrate consisting of an N+ layer 11 and an N− layer 12 is selectively removed so as to provide openings 42 and 43 (FIG. 14A). Then, a P type impurity is diffused through the openings 42 and 43 into the substrate so as to form a P type base region 13 and a P region 44 providing the cathode region of the protective diode incorporated in the transistor. In this step, a silicon dioxide layer is formed on the surface of the substrate (FIG. 14B). The silicon dioxide layer is selectively removed again so as to provide an opening 22 (FIG. 14C), and an N type impurity is diffused through the opening 22 into the base region 13 so as to form an N+ type emitter region 15 (FIG. 11D). After formation of the emitter region 15, a silicon dioxide layer formed on the surface of the substrate in the step of forming the emitter region 15 is selectively removed so as to provide an opening 23 (FIG. 14E). Then, a P type impurity is diffused through the opening 23 into the P type base region 13 so as to form a P+ region 14 serving to provide an ohmic contact between the base electrode and the base region 13 (FIG. 11F). Finally, an emitter electrode E, a base electrode B, an electrode 41 interconnecting the P region 44 and the N− region 12, and a collector electrode C are mounted as shown in FIG. 13, thereby producing a junction type transistor having a protective diode incorporated therein.

In the manufacturing process described above, the N+ type emitter region 15 is formed before formation of the P+ region 14. But, it is possible to form the emitter region 15 after formation of the P+ region 14.

Figure 15:
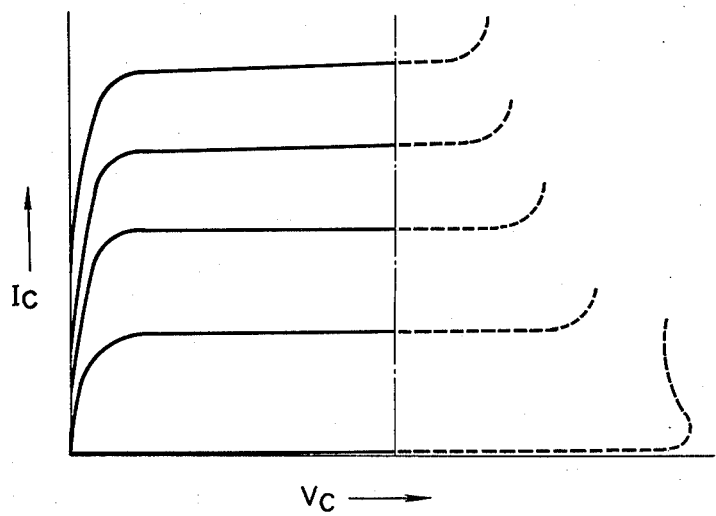
FIG. 15 is a graph showing an example of operation characteristics of a power transistor of this invention.

FIG. 15 shows an example of the operation characteristic of a power transistor of this invention. In the drawing, the solid lines represent the operation characteristics of the power transistor of this invention. Incidentally, the broken lines are added to the solid lines in FIG. 15 so as to represent the operation characteristics of a conventional power transistor which does not include a protective diode. In other words, the entire curves each consisting of a solid line and a broken line represent the operation characteristics of the conventional power transistor. FIG. 15 clearly shows that the $I_c$-$V_c$ curves of the power transistor of this invention do not extend to fall within the S/B limiting region.

Figure 16:
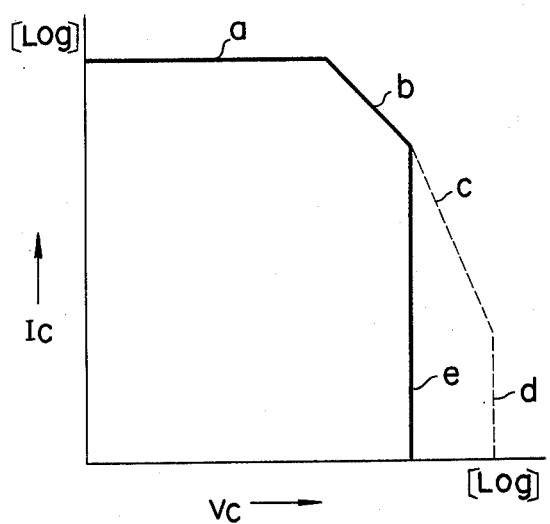
FIG. 16 is a log-log diagram showing the area of safe operation of a power transistor of this invention.

FIG. 16 shows the safe operation areas of power transistors on a log-log scale, with the area defined by the solid lines representing the safe operation area of the power transistor of this invention. It is seen that in the power transistor of this invention, the safe operation area is defined by a current limiting line (a), a thermal resistance limiting line (b) and a voltage limiting line (e). Incidentally, broken lines (c) and (d) denote a S/B limiting line and a voltage limiting line of the conventional power transistor, respectively. It is important to note that the maximum voltage applied to the invented transistor is much lower than that applied to the conventional transistor. This is because the maximum voltage mentioned is restricted in the present invention by the breakdown voltage of the protective diode incorporated in the transistor. It follows that a secondary breakdown phenomenon does not occur in the transistor of this invention. In other words, the safe operation area of the invented transistor is not restricted by the S/B limiting line (c) as seen from FIG. 16.

Figure 17:
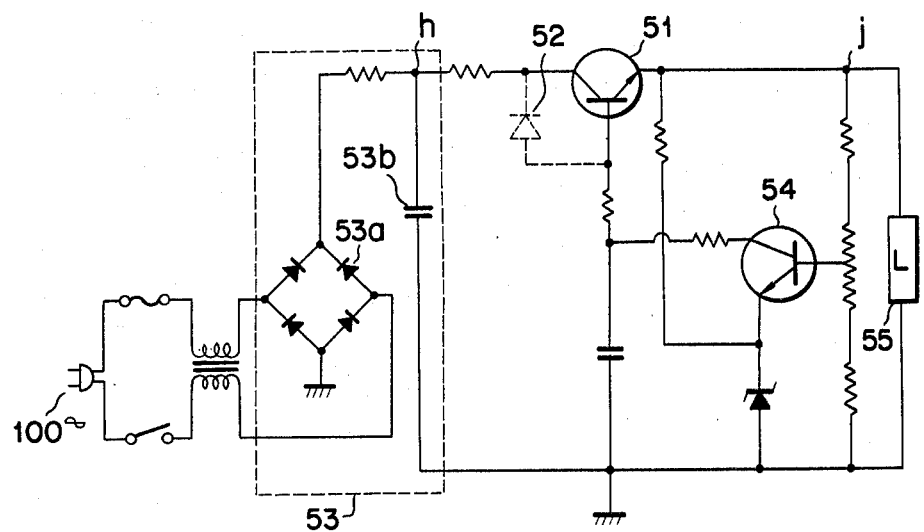
FIG. 17 is the diagram of a power circuit including a power transistor of this invention.

FIG. 17 shows a power circuit used in a television receiver or the like, in which a power transistor of this invention is used in a ripple-reducing circuit. Specifically, reference numeral 51 denotes a power transistor of this invention. If a conventional power transistor is substituted for the transistor 51, it is necessary to provide a diode 52 between the base and collector of the transistor as indicated by broken lines in FIG. 17. But, the diode 52 is unnecessary in the circuit of FIG. 17 because a protective diode is incorporated in the power transistor 51. It is seen that the circuit of FIG. 17 comprises a connector circuit 53, a transistor 54 serving to adjust the rippling degree and a load 55. The converter circuit 53 includes a bridge circuit 53a of diodes and a smoothing capacitor 53b.

In the circuit of FIG. 17, potential of point h is set at 142 V and point j is set at 100 V. It follows that a potential difference of 42 V is applied between the collector and emitter of the power transistor 51 so as to enable the transistor 51 to perform its normal operation. Suppose a short circuit has occurred in the load 55. Naturally the potential of point j is instantly reduced to 0 volt because the load 55 is connected to the ground as shown in the drawing. It follows that a potential difference of 142 V is applied between the collector and emitter of the power transistor 51. In this case, however, breakdown occurs in the protective diode incorporated in the transistor 51 if the breakdown voltage of the diode is suitably selected. In other words, the collector-emitter voltage of the power transistor 51 is controlled by the breakdown voltage of the protective diode. It should be noted that the breakdown current of the protective diode is added to the base current of the power transistor. In addition, the base current thus amplified causes a further amplification of the collector current in accordance with the current amplification factor $h_{FE}$ of the power transistor, resulting in breakage of the fuse and, thus, in protection of the circuit.

As described in detail, a protective diode is incorporated in the power transistor of this invention. Thus, the electric circuit including a power transistor of this invention produces the following merits:

1. Reduction in the number of elements constituting a a transistor circuit, leading to a low manufacturing cost of the transistor circuit.

2. It never happens that a protective diode having an unsuitable breakdown voltage, which is produced separately, is connected to a power transistor.

3. Reduction in labor and space requirement in the wiring step, leading to an improved integration degree and miniaturization of the apparatus.

4. Improvement in reliability of the transistor circuit and apparatus.

5. The electric circuit is enabled to exhibit high resistances to moisture and pollution.

In the embodiments shown in the appended drawings, the technical idea of this invention is applied to NPN transistors. However, it is of course possible to apply the technical idea of this invention to PNP transistors, too.

What we claim is:

1. A junction-type semiconductor device comprising:
    a collector region of one conductivity type forming the substrate of said device and having a main surface;
    a base region of opposite conductivity type extending from said surface of said collector region into said collector region;
    an emitter region of said one conductivity type extending from the surface of said base region into said base region, said base region and said collector region forming a first junction which is reversed biased upon conduction of said device; and
    protection means for forming a second junction in said semiconductor device having a lower breakdown voltage than the breakdown voltage of said first junction, with said second junction electrically coupled in parallel with said first junction and reverse biased upon conduction of said device.

2. The device of claim 1 wherein said protection means comprises a high impurity concentration region of the same conductivity type as said collector region and is located within said collector region with a portion of said high impurity concentration region in contact with said base region to form said second junction.

3. The device of claim 2 wherein said collector region comprises a high impurity concentration portion and a lower impurity concentration portion covering said high impurity concentration portion to form said main surface of said collector region, said base region extends from said surface of said lower impurity concentration portion of said collector region into said lower impurity concentration portion, and said high impurity concentration region of said protection means is located in said lower impurity concentration portion of said collector region.

4. The device of claim 1 wherein said protection means comprises a first semiconductor region of said opposite conductivity type located in said collector region with a portion of said collector region separating said first region from said base region; conductor means for electrically connecting said first region to said base region; and a second semiconductor region of said one conductivity type having a high impurity concentration, said second region being located in said collector region with a portion of said second region contiguous with said first region to form said second junction.

5. The device of claim 1 wherein said protection means comprises a semiconductor region of said one conductivity type located within said base region and separated from said collector region and from said emitter region by said base region to form said second junction; and conductor means for electrically connecting said semiconductor region to said collector region.

6. The device of claim 5 wherein said base region comprises a high impurity concentration, said emitter region extends from the surface of said high impurity concentration portion into said high impurity concentration portion, and said high impurity concentration portion forms at least part of said first junction; and wherein said base region further comprises a lower impurity concentration portion contiguous to said high concentration portion with said semiconductor region located in said lower impurity concentration portion of said base region.

7. A junction-type semiconductor device comprising:
    a collector region of one conductivity type forming the substrate of said device and having a main surface;
    a base region of opposite conductivity type extending from said surface of said collector region into said collector region;
    an emitter region of said one conductivity type extending from the surface of said base region into said base region, with the lower most boundary of said base region and the contiguous portion of said collector region forming a first junction which is reverse biased upon conduction of said device, and said first junction resulting in the formation of a depletion layer in said collector region adjacent said first junction upon conduction of said device, with said depletion layer extending beyond said lowermost boundary of said base region as voltage between the emitter and collector regions of said device is increased; and
    protection means for intercepting said depletion layer with a forward-biased second junction prior to breakdown of said first junction, said protection means including a semiconductor region of said opposite conductivity type positioned in said collector region to form said second junction, and conductor means for electrically connecting said semiconductor region to said collector region.

8. The device of claims 4, 5, or 7 wherein said conductor means comprises a conductive material layer on said main surface of said substrate.

* * * * *